(12) United States Patent
Abou-Khalil et al.

(10) Patent No.: US 11,764,060 B2
(45) Date of Patent: Sep. 19, 2023

(54) FIELD-EFFECT TRANSISTORS WITH A BODY PEDESTAL

(71) Applicant: GLOBALFOUNDRIES U.S. Inc., Santa Clara, CA (US)

(72) Inventors: Michel J. Abou-Khalil, Essex Junction, VT (US); Steven M. Shank, Jericho, VT (US); Alvin J. Joseph, Williston, VT (US); Michael J. Zierak, Colchester, VT (US)

(73) Assignee: GlobalFoundries U.S. Inc., Santa Clara, CA (US)

( * ) Notice: Subject to any disclaimer, the term of this patent is extended or adjusted under 35 U.S.C. 154(b) by 717 days.

(21) Appl. No.: 15/584,121

(22) Filed: May 2, 2017

(65) Prior Publication Data

US 2018/0323066 A1 Nov. 8, 2018

(51) Int. Cl.
*H01L 21/02* (2006.01)
*H01L 21/762* (2006.01)
*H01L 29/06* (2006.01)
*H01L 29/16* (2006.01)
*H01L 29/04* (2006.01)
*H01L 29/10* (2006.01)
*H01L 21/265* (2006.01)
*H01L 29/78* (2006.01)

(52) U.S. Cl.
CPC .. *H01L 21/02667* (2013.01); *H01L 21/26506* (2013.01); *H01L 21/76224* (2013.01); *H01L 29/04* (2013.01); *H01L 29/0649* (2013.01); *H01L 29/0688* (2013.01); *H01L 29/1079* (2013.01); *H01L 29/1095* (2013.01); *H01L 29/16* (2013.01); *H01L 29/78* (2013.01); *H01L 21/02532* (2013.01); *H01L 21/02595* (2013.01)

(58) Field of Classification Search
CPC ........ H01L 21/02; H01L 21/30; H01L 21/76; H01L 21/02532; H01L 21/02595; H01L 21/02667; H01L 21/76224; H01L 29/04; H01L 29/0649; H01L 29/0688; H01L 29/1095; H01L 29/16; H01L 21/26506; H01L 21/30604; H01L 29/1079; H01L 29/78
USPC ...................................... 257/66–70
See application file for complete search history.

(56) References Cited

U.S. PATENT DOCUMENTS

| | | | | |
|---|---|---|---|---|
| 5,943,581 A | * | 8/1999 | Lu | ..... H01L 27/10832 438/386 |
| 5,972,758 A | * | 10/1999 | Liang | ..... H01L 21/762 257/E21.433 |
| 2016/0071925 A1 | * | 3/2016 | Jaffe | ..... H01L 29/0649 257/347 |
| 2016/0093523 A1 | | 3/2016 | Jaffe et al. | |

* cited by examiner

*Primary Examiner* — Meiya Li
(74) *Attorney, Agent, or Firm* — Thompson Hine LLP; Anthony Canale

(57) ABSTRACT

Device structures for a field-effect transistor and methods of forming a device structure for a field-effect transistor. A trench isolation region is formed in a substrate, and surrounds a semiconductor body. An undercut cavity region is also formed in the substrate. The undercut cavity region extends laterally beneath the semiconductor body and defines a body pedestal as a section of the substrate that is arranged in vertical alignment with the semiconductor body.

19 Claims, 5 Drawing Sheets

FIELD-EFFECT TRANSISTORS WITH A BODY PEDESTAL

The present invention relates to semiconductor device fabrication and integrated circuits and, more specifically, to structures for a field-effect transistor and methods for forming a structure for a field-effect transistor.

BACKGROUND

The present invention relates to semiconductor device fabrication and integrated circuits and, more specifically, to device structures for a field-effect transistor and methods for forming a device structure for a field-effect transistor.

Complementary-metal-oxide-semiconductor (CMOS) processes may be used to build a combination of p-type field-effect transistors (pFETs) and n-type field-effect transistors (nFETs) that are coupled to implement logic gates and other types of integrated circuits, such as switches. Field-effect transistors generally include a body region, a source and a drain defined in the body region, and a gate electrode associated with a channel in the body region. When a control voltage exceeding a designated threshold voltage is applied to the gate electrode, a device output current is produced by carrier flow that occurs in an inversion or depletion layer in the channel between the source and drain.

Improved structures for a field-effect transistor and methods for forming a structure for a field-effect transistor are needed.

SUMMARY

In an embodiment of the invention, a method includes forming a trench isolation region in a substrate. The trench isolation region surrounds a semiconductor body. The method further includes forming an undercut cavity region in the substrate that extends laterally beneath the semiconductor body and defines a body pedestal as a section of the substrate that is arranged in vertical alignment with the semiconductor body.

In an embodiment of the invention, a structure includes a trench isolation region in a substrate. The trench isolation region surrounds a semiconductor body. The structure further includes a body pedestal arranged in vertical alignment with the semiconductor body. The body pedestal is surrounded by an undercut cavity region in the substrate that extends laterally beneath the semiconductor body.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
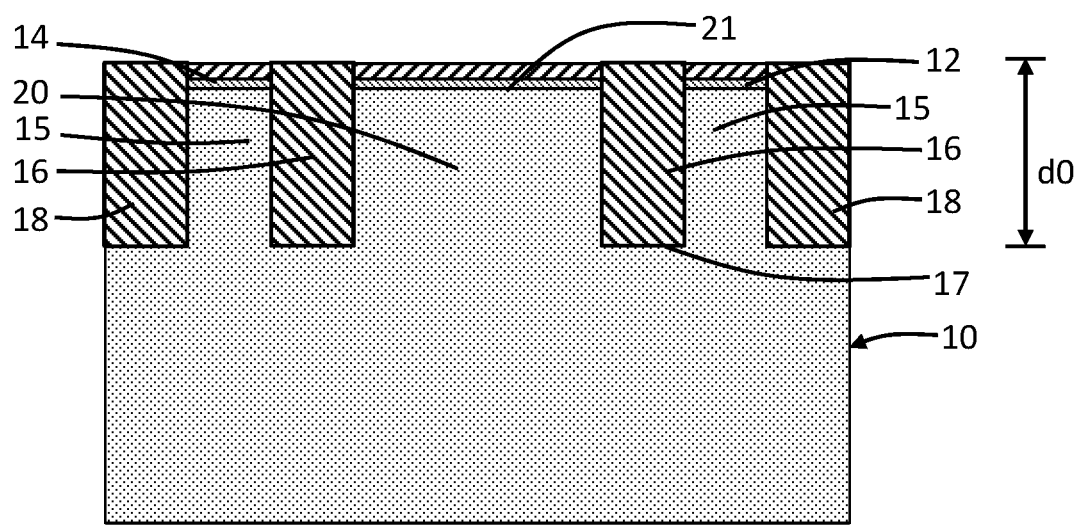
FIGS. 1-8 are cross-sectional views of a structure at successive stages of the processing method in accordance with an embodiment of the invention.

With reference to FIG. 1 and in accordance with embodiments of the invention, a substrate 10 comprises a single-crystal semiconductor material usable to form the devices of an integrated circuit with front-end-of-line (FEOL) processing. For example, the substrate 10 may be a bulk monocrystalline silicon wafer. The semiconductor material constituting the substrate 10 may include an electrically-active dopant that alters its electrical conductivity and may also include an optional epitaxial layer.

Pad layers 12, 14 are located on a top surface of the substrate 10. The materials forming the pad layers 12, 14 may be chosen to etch selectively to the semiconductor material constituting the substrate 10 and to be readily removed at a subsequent fabrication stage. The pad layers 12, 14 operate as protection layers for the top surface of the substrate 10 during, for example, etching processes. Pad layer 12 may be composed of a dielectric material, such as silicon dioxide ($SiO_2$) grown by oxidizing the top surface of substrate 10 or deposited by chemical vapor deposition (CVD). Pad layer 14 may be composed of a dielectric material, such as silicon nitride ($Si_3N_4$) deposited by CVD.

Shallow trench isolation regions 16, 18 are formed in the substrate 10 and extend vertically through the pad layers 12, 14 into the substrate 10. The shallow trench isolation region 16 surrounds a semiconductor body 20 that may be used in front-end-of-line (FEOL) device fabrication, and the shallow trench isolation region 18 surrounds the shallow trench isolation region 16 and the semiconductor body 20. A section 15 of the substrate 10 is located horizontally between the shallow trench isolation region 16 and the shallow trench isolation region 18. The shallow trench isolation region 16 includes an end at the top surface 21 of the semiconductor body 20, an opposite end 17 located at a depth, d0, relative to the top surface 21 of the semiconductor body 20, and vertical sidewalls connecting the opposite ends and defining inner edges that are coextensive with the outer edges of the semiconductor body 20.

The shallow trench isolation regions 16, 18 may be formed by a shallow trench isolation (STI) technique in which trenches are formed in the substrate 10 and then filled with an electrical insulator that is deposited and planarized with, for example, chemical mechanical polishing (CMP). The shallow trench isolation regions 16, 18 may be comprised of a dielectric material, such as silicon dioxide ($SiO_2$), deposited by CVD.

Figure 2:
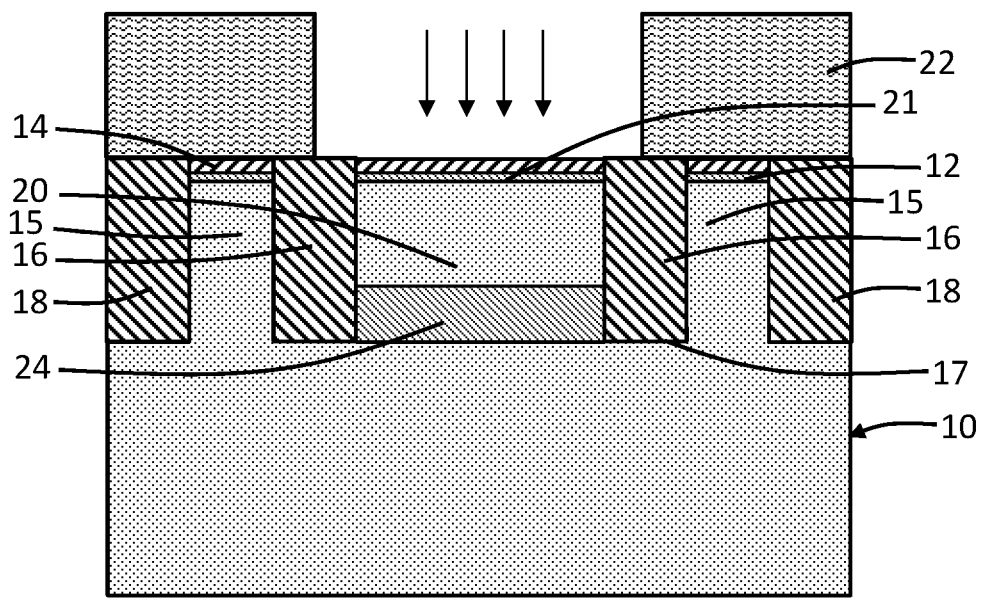

With reference to FIG. 2 in which like reference numerals refer to like features in FIG. 1 and at a subsequent fabrication stage, an implantation mask 22 is formed on the top surface of the pad layer 14. The implantation mask 22 may be constituted by a photoresist that is applied as a coating by a spin coating process, pre-baked, exposed to light projected through a photomask, baked after exposure, and developed with a chemical developer to form an opening that exposes the semiconductor body 20 while masking adjacent field surfaces. The opening in the implantation mask 22 overlaps with the vertical inner edges of the shallow trench isolation region 16 that directly surround and are closest to the vertical outer edges of the semiconductor body 20.

An amorphized layer 24 is formed within the semiconductor body 20. The amorphized layer 24 is displaced vertically from the top surface 21 of the semiconductor body 20. As a result, a section of the semiconductor body 20 vertically between the top surface 21 and the amorphized layer 24 exhibits significantly less damage and is not amorphized. The amorphized layer 24 is located laterally inside the shallow trench isolation region 16 and bridges across the width of the shallow trench isolation region 16 and, therefore, across the entire width of the semiconductor body 20 inside the inner boundary defined by the shallow trench isolation region 16. The amorphized layer 24 may have a depth profile that is located, at least in part, between the top surface 21 and the end 17 of the shallow trench isolation region 16 (i.e., at least in part at a shallower depth relative to the top surface 21 of the semiconductor body 20 than the depth of the end 17). The depth profile for the amorphized layer 24 in the semiconductor is not located in its entirety below the end 17 of the shallow trench isolation region 16 (i.e., a greater depth relative to the top surface 21 of the semiconductor body 20 than the depth of the end 17).

The amorphized layer 24 may be formed by ion implantation that introduces energetic ions, as indicated diagrammatically by the single-headed vertical arrows, through the top surface 21 of the semiconductor body 20. The ion trajectories penetrate into the semiconductor material of the semiconductor body 20 with a depth profile parameterized by a projected range and a range straggle. The crystal structure of the semiconductor body 20 is altered (i.e., amorphized) over the thickness of the amorphized layer 24 relative to its initial single-crystal state by implantation damage induced by the ions. The ions may be generated from a suitable source gas and implanted into the semiconductor body 20 with selected implantation conditions using an ion implantation tool. The implantation conditions (e.g., ion species, dose, kinetic energy) may be selected to tune the characteristics (e.g., depth profile and amount of damage) of the amorphized layer 24. The amorphized layer 24 may be formed using chained implants (e.g., multiple discrete implantations of ions performed at different kinetic energies). In an embodiment, the ion species of the ions that are implanted to form the amorphized layer 24 may be argon (Ar). The implantation mask 22 masks the sections 15 of the substrate 10 such that the semiconductor material in these sections 15 is not implanted and, therefore, not amorphized.

Figure 3:
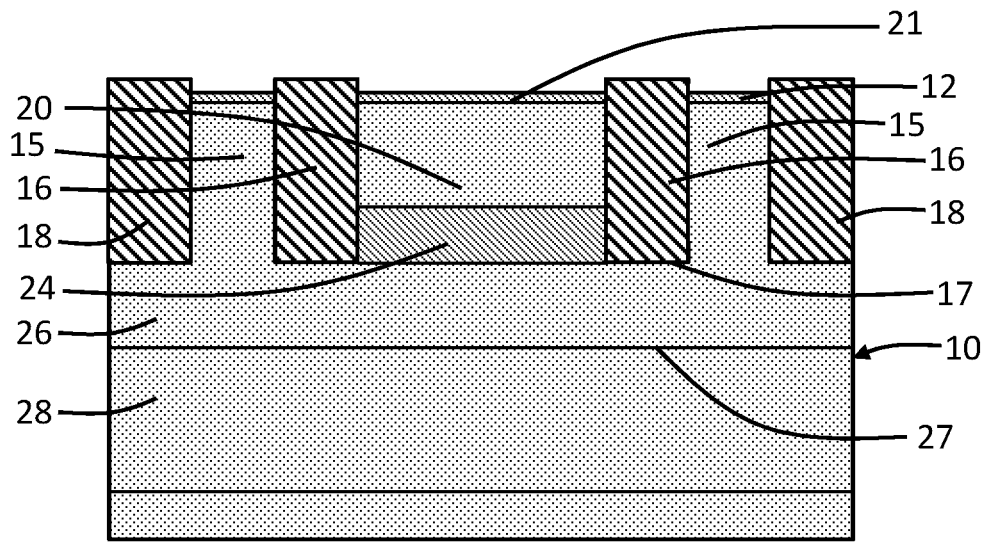

With reference to FIG. 3 in which like reference numerals refer to like features in FIG. 2 and at a subsequent fabrication stage, the pad layer 14 is removed and wells 26, 28 are formed as doped regions in the substrate 10. The section 15 of the substrate 10 between the shallow trench isolation region 16 and the shallow trench isolation region 18 and the semiconductor body 20 are also implanted when the well 26 is formed. The wells 26, 28 are comprised of semiconductor material having opposite conductivity types and a p-n junction 27 is defined between the well 26 and the well 28. The well 26 abuts the amorphized layer 24 and the well 28 defines a tub of opposite conductivity type semiconductor material in which the well 26 is located.

In an embodiment, the wells 26, 28 may be formed by ion implantation. To that end, the section 15, semiconductor body 20, and well 26 may be implanted with ions of a p-type dopant (e.g., boron B)) selected from Group III of the Periodic Table in a concentration that is effective to impart p-type conductivity to the constituent semiconductor material, and the well 28 may be implanted with ions of an n-type dopant selected from Group V of the Periodic Table (e.g., arsenic (As) or phosphorus (P)) in a concentration effective to impart n-type conductivity to the semiconductor material.

Figure 4:
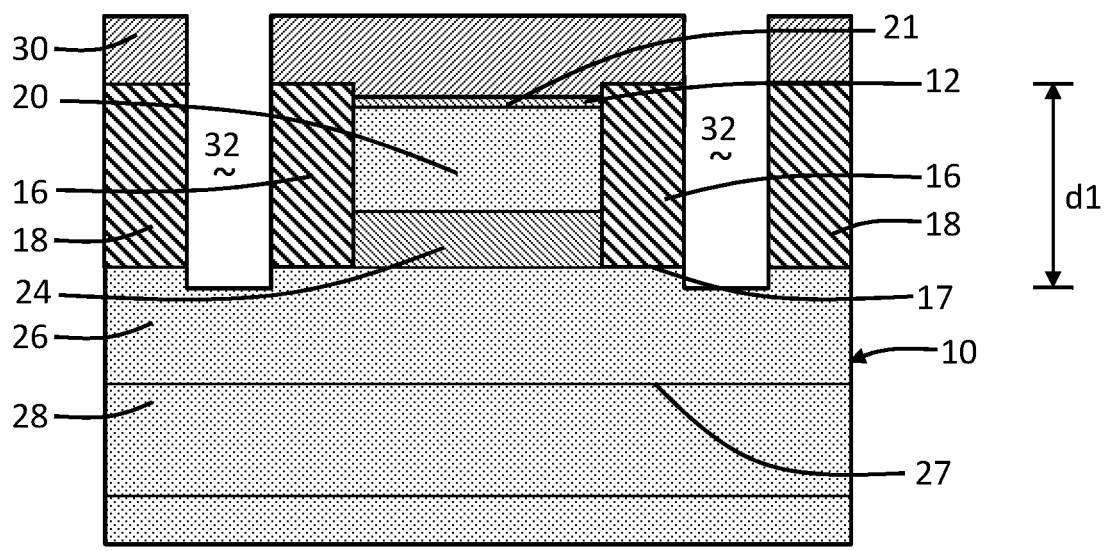

With reference to FIG. 4 in which like reference numerals refer to like features in FIG. 3 and at a subsequent fabrication stage, an etch mask 30 is formed on the top surface of the pad layer 12. The etch mask 30 may comprise a photoresist that is applied as a coating by a spin coating process, pre-baked, exposed to light projected through a photomask, baked after exposure, and developed with a chemical developer to form an opening that coincides in position with the section 15 of the substrate 10. The section 15 of the substrate 10 is removed to form a trench 32 that extends about and surrounds the shallow trench isolation region 16 and the semiconductor body 20. The trench 32 extends past the end 17 of the shallow trench isolation region 16 and to a shallow depth into the well 26. The trench 32 does not penetrate through the well 26 and therefore does not extend to the well 28.

Figure 5:
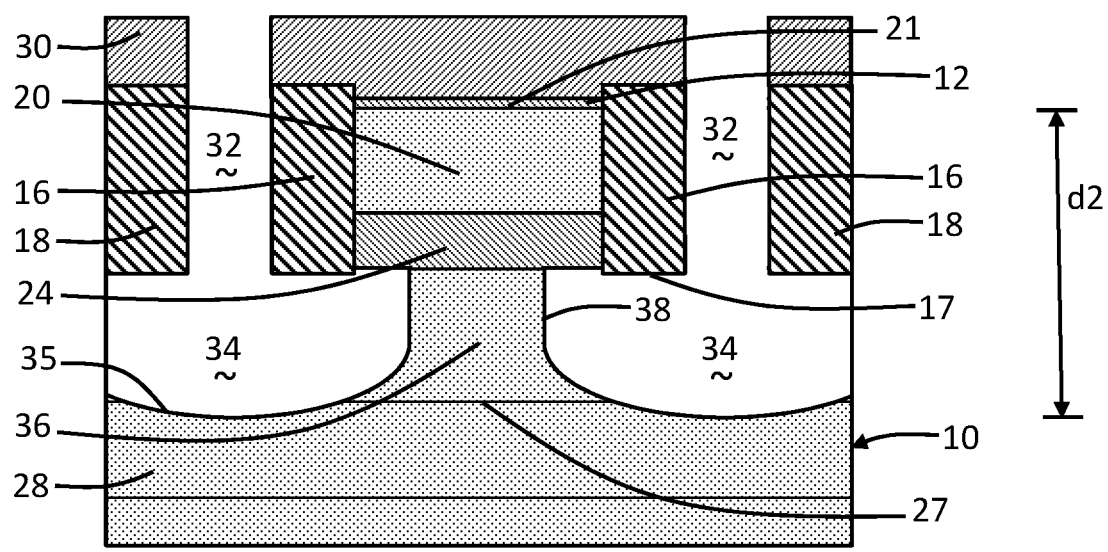

With reference to FIG. 5 in which like reference numerals refer to like features in FIG. 4 and at a subsequent fabrication stage, an undercut cavity region 34 is formed in the substrate 10 that extends laterally beneath the semiconductor body 20. The undercut cavity region 34 may be formed by an etching process, such as a wet chemical etch or an isotropic dry etch, that laterally and vertically removes the semiconductor material of the substrate 10. The etch mask 30 and intervening section of the pad layer 12 protects the top surface 21 of the semiconductor body 20 during etching process. At the conclusion of the etching process, the semiconductor body 20 is intact. The trench 32 provides the access to the substrate 10 at a depth that is greater than the end 17 of the shallow trench isolation region 16. The etchant, which removes the material of the well 26 selective to the material of the amorphized layer 24, which functions to protect the semiconductor body 20 from the etching process when the undercut cavity region 34 is formed. As used herein, the term "selective" in reference to a material removal process (e.g., etching) denotes that the material removal rate (i.e., etch rate) for the targeted material is higher than the material removal rate (i.e., etch rate) for at least another material exposed to the material removal process.

A body pedestal 36 is arranged interior of the undercut cavity region 34 and represents a residual section of the well 26 that remains at the conclusion of the etching process. The body pedestal 36 is located vertically beneath the semiconductor body 20 and has a sidewall 38 representing a surface that extends from the amorphized layer 24 to the well 28. The extent of the lateral etching may be controlled to ensure that the body pedestal 36 is retained when the undercut cavity region 34 is formed. In an embodiment in which the lateral etching component is symmetrical, the body pedestal 36 may be centered relative to the semiconductor body 20.

The undercut cavity region 34 is bordered by surfaces 35 of the shallow trench isolation regions 16, 18, the well 28 in substrate 10, the semiconductor body 20, and the body pedestal 36. The semiconductor material of the body pedestal 36, or at least the section of the body pedestal 36 in contact with the amorphized layer 24, has the same conductivity type as the well 26. The undercut cavity region 34 may extend vertically to a depth d2 within the substrate 10 that penetrates through the p-n junction 27 and into the well 28, which reduces the area of the p-n junction 27. The p-n junction 27 is retained at the interface between the body pedestal 36 and the well 28 in the underlying substrate 10, which is interior of the undercut cavity region 34 and beneath the semiconductor body 20.

Figure 6:
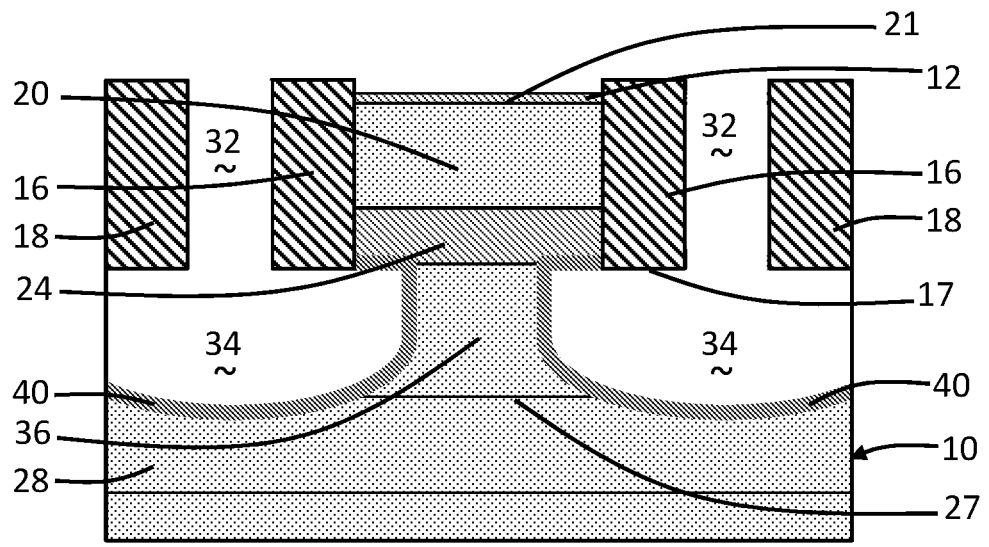

With reference to FIG. 6 in which like reference numerals refer to like features in FIG. 5 and at a subsequent fabrication stage, the etch mask 30 may be removed after the trench 32 is defined by the etching process. If comprised of a photoresist, the etch mask 30 may be removed by ashing or solvent stripping, followed by a conventional cleaning process.

A dielectric layer 40 is formed on the surfaces 35 that border the undercut cavity region 34, including the surface represented by the sidewall 38 of the body pedestal 36. The dielectric layer 40 may be comprised of an electrical insulator, such as silicon dioxide (e.g., $SiO_2$) formed by a thermal oxidation process. The body pedestal 36 is narrowed in width because the thermal oxidation process consumes the semiconductor material of the body pedestal 36 at its sidewall 38. However, a central core of the body pedestal 36 is not oxidized. The surface of the amorphized layer 24 exposed by the undercut cavity region 34 is also oxidized. The semiconductor body 20 is located vertically between the overlying section of the pad layer 12 and the underlying amorphized layer 24 and is therefore protected against thermal oxidation by the pad layer 12, the amorphized layer 24, and the shallow trench isolation region 16.

Figure 7:
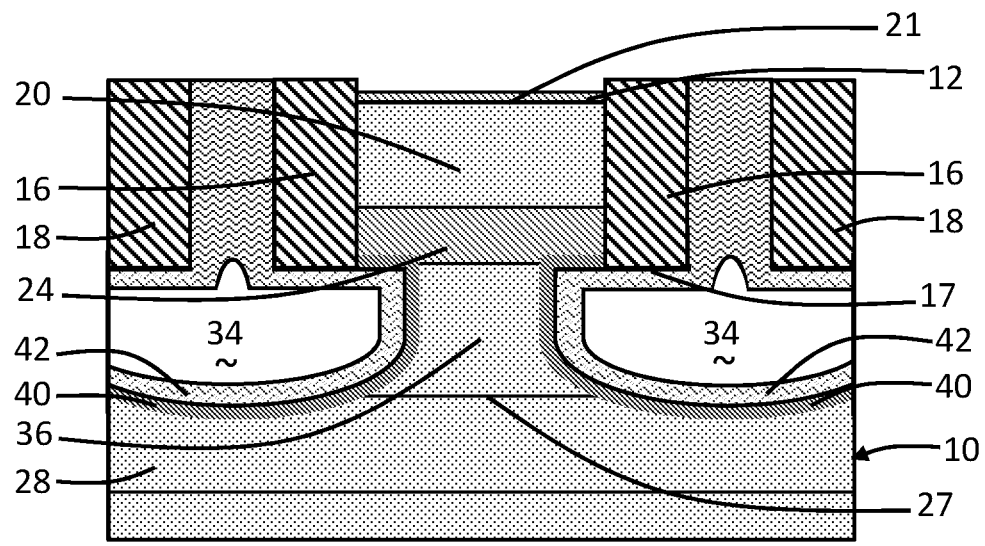

With reference to FIG. 7 in which like reference numerals refer to like features in FIG. 6 and at a subsequent fabrication stage, a polycrystalline semiconductor layer 42 may be formed inside the undercut cavity region 34 and on the surfaces bordering the undercut cavity region 34 and that are covered by the dielectric layer 40. The polycrystalline semiconductor layer 42 pinches off the trench 32 such that the trench 32 is occluded and the pathway from the top surface to the undercut cavity region 34 is closed. The trench 32 is occluded by material from the polycrystalline semiconductor layer 42 before the undercut cavity region 34 can be filled with a section of the polycrystalline semiconductor layer 42. In an embodiment, the polycrystalline semiconductor layer 42 has a conformal thickness. The polycrystalline semiconductor layer 42 is located on the surfaces 35, but is in indirect contact with the surfaces 35 due to the physical positioning of the dielectric layer 40.

The polycrystalline semiconductor layer 42 may be comprised of a trap-rich material, such as a polycrystalline semiconductor material like polycrystalline silicon (i.e., polysilicon) or another type of engineered low-mobility silicon layer. The polycrystalline semiconductor layer 42 may be deposited by chemical vapor deposition under deposition conditions (e.g., temperature and pressure) selected to impart a high density of electrically-active carrier traps. In an embodiment, the polycrystalline semiconductor layer 42 may be deposited with low-temperature CVD and then planarized using chemical-mechanical polishing (CMP) to be coplanar with the shallow trench isolation regions 16, 18. In an embodiment, the deposition conditions may be selected to introduce carrier traps at a density that imparts the polycrystalline semiconductor layer 42 with a resistivity that is greater than 1 kΩ-cm.

Figure 8:
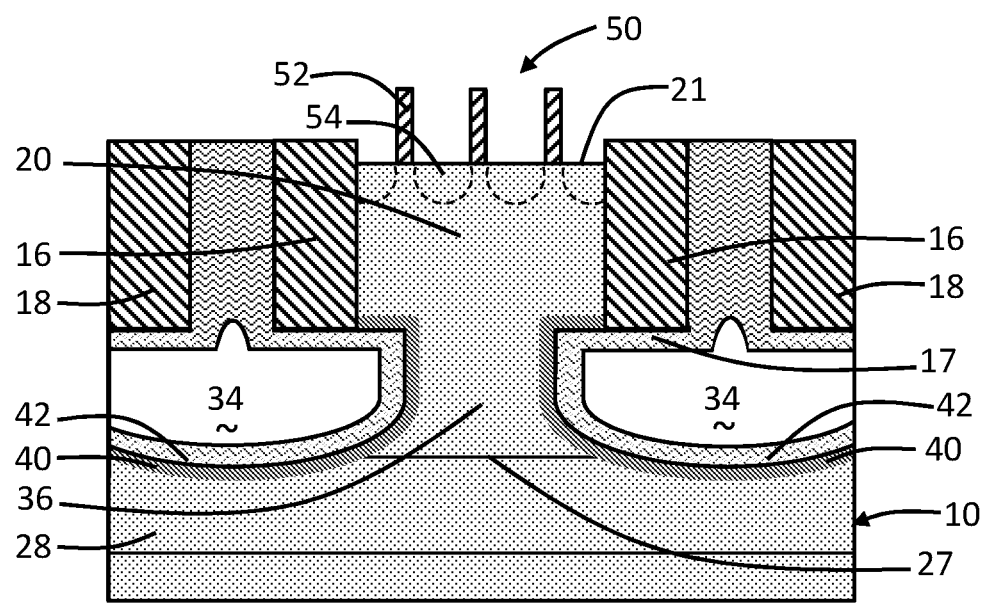

With reference to FIG. 8 in which like reference numerals refer to like features in FIG. 7 and at a subsequent fabrication stage, a thermal process (e.g., an anneal) may be used to recrystallize the amorphized layer 24 back into a layer of single crystal semiconductor material located vertically between the body pedestal 36 and the semiconductor body 20. The thermal process repairs or heals the damage to (i.e., recrystallize or regrow) the semiconductor material of the amorphized layer 24. The crystalline template for the damage repair is established at the interface between the body pedestal 36 and the amorphized layer 24 and at the interface between the amorphized layer 24 and the section of the semiconductor body 20 vertically between the top surface 21 and the amorphized layer 24. The thermal process is selected and controlled such that the repaired semiconductor material returns to its pre-implanted single-crystal state and is subsumed by the semiconductor body 20. An exemplary thermal process may be performed in a reducing atmosphere (e.g., hydrogen) and at a temperature ranging from 700° C. to 800° C. for a duration sufficient to alleviate the crystalline damage A device structure, generally indicated by reference numeral 50, may be formed by front-end-of-line (FEOL) processing using the semiconductor body 20. For example, the device structure 50 may be a switch field-effect transistor that includes multiple gate fingers 52 having a parallel arrangement in rows and wired together at one end. Each gate finger 52 may include a gate electrode and a gate dielectric formed by depositing a layer stack and patterning the layer stack with photolithography and etching. The gate electrode may be composed of a conductor, such as doped polycrystalline silicon (i.e., polysilicon), and the gate dielectric may be composed of an electrical insulator, such as silicon dioxide ($SiO_2$). The device structure 50 may include other elements such as source/drain regions 54 formed in the semiconductor body 20 by introducing a dopant, a gate dielectric layer between each gate finger 52 and the top surface 21 of the semiconductor body 20, halo regions, and lightly doped drain (LDD) extensions formed in the semiconductor material of the semiconductor body 20, and non-conductive spacers (not shown) formed on the vertical sidewalls of the gate fingers 52.

Larger-area-body field effect transistors may be formed that have a reduced junction area between the well 28 (i.e., the triple well) and the well 26 (i.e., the active well) so as to reduce harmonic distortion caused by RF voltage drops across the junctions between the wells 26, 28 and between the well 28 and the substrate 10.

Figure 9:
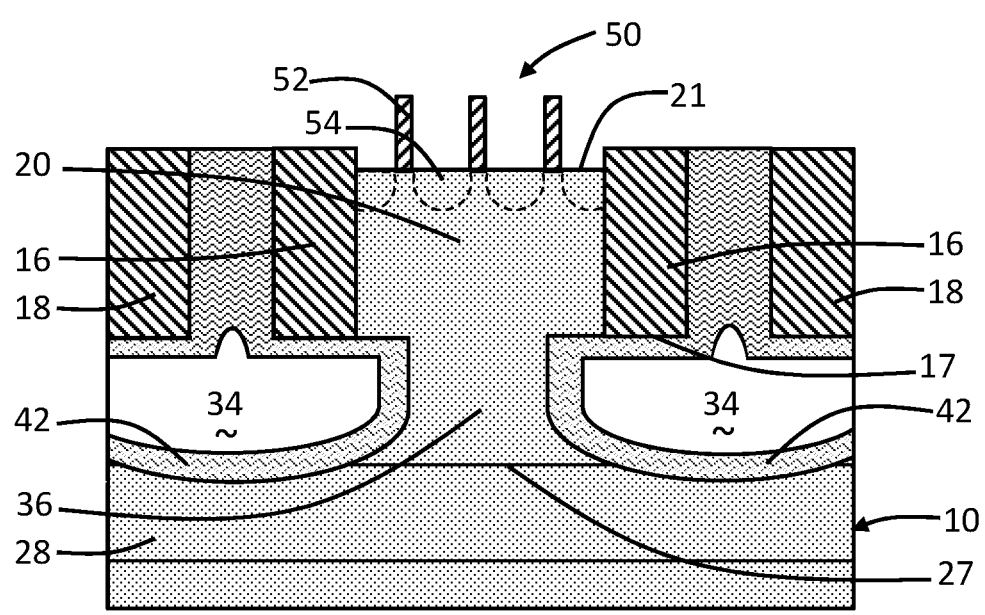
FIG. 9 is a cross-sectional view of a structure in accordance with an alternative embodiment of the invention.

With reference to FIG. 9 in which like reference numerals refer to like features in FIG. 8 and in accordance with alternative embodiments of the invention, the dielectric layer 40 may be omitted, and the polycrystalline semiconductor layer 42 may be deposited in direct contact with the surfaces 35 bordering the undercut cavity region 34.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product. For example, the field-effect transistor and/or handle wafer contact in the embodiments described herein may be used in a switch, a low noise amplifier, or a logic circuit.

References herein to terms such as "vertical", "horizontal", "lateral", etc. are made by way of example, and not by way of limitation, to establish a frame of reference. Terms such as "horizontal" and "lateral" refer to a direction in a plane parallel to a top surface of a semiconductor substrate, regardless of its actual three-dimensional spatial orientation. Terms such as "vertical" and "normal" refer to a direction perpendicular to the "horizontal" and "lateral" direction. Terms such as "above" and "below" indicate positioning of elements or structures relative to each other and/or to the top surface of the semiconductor substrate as opposed to relative elevation.

A feature "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
   a first trench isolation region in a substrate, the first trench isolation region surrounding a semiconductor body;
   a device structure including a source/drain region in the semiconductor body;
   a body pedestal arranged in vertical alignment with the semiconductor body, the body pedestal comprised of a first semiconductor material having a first conductivity type, the body pedestal surrounded by an undercut cavity region in the substrate that extends laterally beneath the semiconductor body, and the body pedestal including a sidewall extending from the semiconductor body to contact a portion of the substrate beneath the body pedestal; and
   a well in the substrate beneath the body pedestal, the well comprised of a second semiconductor material having a second conductivity type opposite from the first conductivity type,
   wherein the body pedestal and the well have an interface defining a p-n junction.

2. The structure of claim 1 wherein the device structure is a switch field-effect transistor.

3. The structure of claim 1 wherein the undercut cavity region extends laterally beneath the first trench isolation region.

4. A structure comprising:
   a first trench isolation region in a substrate, the first trench isolation region surrounding a semiconductor body;
   a device structure including a source/drain region in the semiconductor body;
   a body pedestal arranged in vertical alignment with the semiconductor body, the body pedestal surrounded by an undercut cavity region in the substrate that extends laterally beneath the semiconductor body, the body pedestal comprised of a first semiconductor material having a first conductivity type, and the body pedestal including a sidewall extending from the semiconductor body to contact a portion of the substrate beneath the body pedestal;
   a well in the substrate beneath the body pedestal, the well comprised of a second semiconductor material having a second conductivity type opposite from the first conductivity type; and
   a semiconductor layer comprised of a polycrystalline semiconductor material,
   wherein the body pedestal and the well have an interface defining a p-n junction, the first trench isolation region, the substrate, and the semiconductor body have a plurality of surfaces that border the undercut cavity region, and the semiconductor layer is located on the sidewall of the body pedestal and the plurality of surfaces.

5. The structure of claim 4 wherein the semiconductor layer has a conformal thickness.

6. The structure of claim 4 further comprising:
   a dielectric layer between the semiconductor layer and the surfaces and between the semiconductor layer and the sidewall of the body pedestal.

7. The structure of claim 4 wherein the semiconductor layer is comprised of trap-rich polysilicon.

8. The structure of claim 4 wherein the semiconductor layer is in direct contact with the surfaces and the sidewall of the body pedestal.

9. The structure of claim 4 further comprising:
   a second trench isolation region in the substrate, the second trench isolation region surrounding the first trench isolation region and the semiconductor body,
   wherein the semiconductor layer includes a section that is located laterally between the first trench isolation region and the second trench isolation region.

10. The structure of claim 4 wherein the device structure is a switch field-effect transistor.

11. A method comprising:
    forming a first trench isolation region in a substrate, wherein the first trench isolation region surrounds a semiconductor body;
    forming an undercut cavity region in the substrate that extends laterally beneath the semiconductor body and defines a body pedestal as a first section of the substrate that is arranged in vertical alignment with the semiconductor body, wherein the body pedestal is comprised of a first semiconductor material having a first conductivity type;
    forming a well in the substrate beneath the body pedestal, wherein the well is comprised of a second semiconductor material having a second conductivity type opposite from the first conductivity type; and
    forming a device structure including a source/drain region in the semiconductor body,
    wherein the body pedestal includes a sidewall extending from the semiconductor body to contact a portion of the substrate beneath the body pedestal, and the body pedestal and the well have an interface defining a p-n junction.

12. The method of claim 11 wherein the first trench isolation region, the substrate, and the semiconductor body include a plurality of surfaces that border the undercut cavity region, and further comprising:
    forming a semiconductor layer on the surfaces and the sidewall of the body pedestal,
    wherein the semiconductor layer is comprised of a polycrystalline semiconductor material.

13. The method of claim 12 wherein the semiconductor layer is deposited with a conformal thickness.

14. The method of claim 12 further comprising:
    before the semiconductor layer is formed, forming a dielectric layer on the surfaces and the sidewall of the body pedestal.

15. The method of claim 11 further comprising:
    forming a second trench isolation region in the substrate, wherein the second trench isolation region surrounds the first trench isolation region and the semiconductor body; and
    before the undercut cavity region is formed in the substrate, removing a second section of the substrate from a space between the first trench isolation region and the second trench isolation region to open a trench.

16. The method of claim 15 wherein the trench provides a pathway for an etching process used to form the undercut cavity region.

17. The method of claim 11 wherein the undercut cavity region is formed by an etching process, and further comprising:
- before the undercut cavity region is formed in the substrate, forming an amorphized layer in the semiconductor body,
- wherein the amorphized layer is located between a top surface of the semiconductor body and the undercut cavity region such that a portion of the semiconductor body between the amorphized layer and the top surface is masked during the etching process.

18. The method of claim 17 further comprising:
- after the undercut cavity region is formed in the substrate, recrystallizing the amorphized layer in the semiconductor body.

19. The method of claim 11 wherein the device structure is a switch field-effect transistor.

* * * * *

UNITED STATES PATENT AND TRADEMARK OFFICE
CERTIFICATE OF CORRECTION

| | |
|---|---|
| PATENT NO. | : 11,764,060 B2 |
| APPLICATION NO. | : 15/584121 |
| DATED | : September 19, 2023 |
| INVENTOR(S) | : Michel J. Abou-Khalil et al. |

It is certified that error appears in the above-identified patent and that said Letters Patent is hereby corrected as shown below:

In the Specification

Column 1, Lines 9-14 should be deleted:
"BACKGROUND
The present invention relates to semiconductor device fabrication and integrated circuits and, more specifically, to device structures for a field-effect transistor and methods for forming a device structure for a field-effect transistor."

And should be replaced with:
--BACKGROUND-- immediately after Title, before the first paragraph appearing on Lines 4-7.

Signed and Sealed this
Seventeenth Day of October, 2023

Katherine Kelly Vidal
*Director of the United States Patent and Trademark Office*